US012662775B2

(12) United States Patent
Nishimori et al.

(10) Patent No.: US 12,662,775 B2
(45) Date of Patent: Jun. 23, 2026

(54) CIRCUIT BOARD UNWOVEN FABRIC, CIRCUIT BOARD PREPREG USING SAME AND CIRCUIT BOARD USING SAME

(71) Applicant: DUPONT SAFETY & CONSTRUCTION, INC., Wilmington, DE (US)

(72) Inventors: Yuhei Nishimori, Kochi (JP); Masahiko Ueta, Kochi (JP)

(73) Assignee: DUPONT SAFETY & CONSTRUCTION, INC., Wilmington, DE (US)

( * ) Notice: Subject to any disclaimer, the term of this patent is extended or adjusted under 35 U.S.C. 154(b) by 258 days.

(21) Appl. No.: 18/555,074

(22) PCT Filed: Apr. 12, 2022

(86) PCT No.: PCT/JP2022/017573
§ 371 (c)(1),
(2) Date: Oct. 12, 2023

(87) PCT Pub. No.: WO2022/220234
PCT Pub. Date: Oct. 20, 2022

(65) Prior Publication Data
US 2024/0125050 A1     Apr. 18, 2024

(30) Foreign Application Priority Data
Apr. 12, 2021     (JP) .................................. 2021-067010

(51) Int. Cl.
H05K 1/03          (2006.01)
D21H 13/26       (2006.01)
(Continued)

(52) U.S. Cl.
CPC ............. D21H 15/02 (2013.01); D21H 13/26 (2013.01); D21H 21/00 (2013.01);
(Continued)

(58) Field of Classification Search
CPC ......... H05K 1/0366; H05K 2201/0293; H05K 2201/0296; H05K 2201/0284; D21H 13/26; D21H 21/00
See application file for complete search history.

(56) References Cited

U.S. PATENT DOCUMENTS

| | | | |
|---|---|---|---|
| 4,729,921 | A | 3/1988 | Tokarsky |
| 5,223,094 | A | 6/1993 | Kirayoglu et al. |
| | | (Continued) | |

FOREIGN PATENT DOCUMENTS

| | | |
|---|---|---|
| JP | 6-257042 A | 9/1994 |
| JP | 8-127994 A | 5/1996 |
| | (Continued) | |

OTHER PUBLICATIONS

JP 2004183178 and translation (Year: 2004).*
PCT International Search Report for Application No. PCT/JP2022/017573; ISA/JP; Jun. 2, 2022.

*Primary Examiner* — Jeremy C Norris
(74) *Attorney, Agent, or Firm* — Ram W. Sabnis

(57)          ABSTRACT

A circuit board nonwoven fabric comprising a paper-formed structure which comprises a plurality of thick fibers in which the portion of greatest fiber diameter is 5 μm or greater, and a plurality of fine fibers in which the portion of greatest fiber diameter is less than 5 μm, wherein an average fiber length of the thick fibers is greater than an average fiber length of the fine fibers, the number of fine fibers is greater than the number of thick fibers, and the thick fibers have a flat shape with a major axis and a minor axis, the minor axis being oriented in a thickness direction of the paper-formed structure.

6 Claims, 2 Drawing Sheets

(51) Int. Cl.
    *D21H 15/02*     (2006.01)
    *D21H 21/00*     (2006.01)

(52) U.S. Cl.
    CPC ..................... *H05K 1/0366* (2013.01); *H05K 2201/0284* (2013.01); *H05K 2201/0293* (2013.01)

(56) References Cited

U.S. PATENT DOCUMENTS

| | | |
|---|---|---|
| 5,314,742 A | 5/1994 | Kirayoglu et al. |
| 5,910,231 A | 6/1999 | Kirayoglu et al. |
| 6,890,635 B2 | 5/2005 | Lin et al. |
| 11,078,627 B2 | 8/2021 | Afshari et al. |
| 2006/0113700 A1 | 6/2006 | Hartzler et al. |
| 2009/0142567 A1 | 6/2009 | Kanakarajan et al. |
| 2016/0197325 A1 | 7/2016 | Alvarado Chacon et al. |

FOREIGN PATENT DOCUMENTS

| | | |
|---|---|---|
| JP | 2001-159091 A | 6/2001 |
| JP | 2003-49388 A | 2/2003 |
| JP | 2004-51951 A | 2/2004 |
| JP | 2004-100142 A | 4/2004 |
| JP | 2004-183178 A | 7/2004 |
| JP | 2006-200066 A | 8/2006 |
| JP | 2009-126917 A | 6/2009 |

* cited by examiner

CIRCUIT BOARD UNWOVEN FABRIC, CIRCUIT BOARD PREPREG USING SAME AND CIRCUIT BOARD USING SAME

TECHNICAL FIELD

The present invention relates to a circuit board nonwoven fabric, a circuit board prepreg employing same, and a circuit board employing the circuit board prepreg.

BACKGROUND ART

As the mounting density on circuit boards has increased, there has been a demand for greater surface smoothness of circuit board prepregs which are used in such circuit boards. That is to say, a circuit pattern comprising a copper foil or the like is arranged on the surface of the circuit board prepreg, but when the circuit board prepreg has low surface smoothness, wiring breakages in the circuit pattern arise and there are greater variations in through-holes. Conventional practice is therefore to improve the smoothness of the actual circuit board nonwoven fabric which serves to produce the circuit board prepreg.

Specifically, the smoothness is improved by producing the circuit board nonwoven fabric using fine denier aramid fibers having a fiber diameter of 10 μm or less and preferably 8 μm or less (this is given as a first conventional example, but there is a similar configuration in Patent Document 1 indicated below).

Furthermore, it is also known to try and thin the circuit board nonwoven fabric by producing the circuit board nonwoven fabric using only flattened, short aramid fibers (this is given as a second conventional example, but there is a similar configuration in Patent Document 2 indicated below).

Additionally, it is also known to obtain a circuit board nonwoven fabric which has a high bulk density even at a low basis weight by using flattened short fibers (this is given as a third conventional example, but there is a similar configuration in Patent Document 3 indicated below).

PRIOR ART DOCUMENTS

Patent Document

Patent Document 1: JP 2004-51951 A
Patent Document 2: JP 2003-49388 A
Patent Document 3: JP 2006-200066 A

SUMMARY OF THE INVENTION

Problems to be Solved by the Invention

In the first conventional example, the circuit board nonwoven fabric is produced, without the use of thick fibers, by means of fine denier aramid fibers having a fiber diameter of 10 μm or less and preferably 8 μm or less, and therefore the smoothness can be improved. However, when the circuit board nonwoven fabric is produced by using only fine fibers having a fiber diameter of 10 μm or less and preferably 8 μm or less, the fine fibers have poor producibility and are expensive, which makes the circuit board nonwoven fabric expensive in the end. Of course, this also increases the costs of a circuit board prepreg employing the circuit board nonwoven fabric, and a circuit board employing the circuit board prepreg. Furthermore, a nonwoven fabric comprising only fine fibers has reduced strength, and therefore it is necessary to increase the amount of resin which is contained in the circuit board nonwoven fabric covering front and rear surfaces, in order to increase the strength of the circuit board prepreg, and this leads to increased thickness of the circuit board prepreg and the circuit board as a result.

Furthermore, in the second conventional example, only flattened, short aramid fibers are used, and therefore it is possible to achieve a thinner circuit board nonwoven fabric. However, when wet papermaking is performed with only short, flattened aramid fibers, the amount of short, flattened aramid fibers becoming detached from the wire increases during the wet papermaking, which increases the cost because of a poor yield.

Additionally, in the third conventional example, it is possible to obtain a circuit board nonwoven fabric which has a high bulk density even at a low basis weight by using flattened short fibers, but the amount of short, flattened aramid fibers becoming detached from the wire increases during the wet papermaking, which increases the cost because of a poor yield, in the same way as with the second conventional example.

The objective of the present invention therefore lies in suppressing an increase in cost of a circuit board nonwoven fabric, a circuit board prepreg employing same, and a circuit board employing the circuit board prepreg, while also achieving a thinner circuit board nonwoven fabric, circuit board prepreg employing same, and circuit board employing the circuit board prepreg.

Means for Solving the Problems

In order to achieve the objective above, a circuit board nonwoven fabric according to a first invention in the present invention constitutes a circuit board nonwoven fabric comprising a paper-formed structure which comprises a plurality of thick fibers in which the portion of greatest fiber diameter is 5 μm or greater, and a plurality of fine fibers in which the portion of greatest fiber diameter is less than 5 μm, wherein an average fiber length of the thick fibers is greater than an average fiber length of the fine fibers, the number of fine fibers is greater than the number of thick fibers, and the thick fibers have a flat shape with a major axis and a minor axis, the minor axis being oriented in a thickness direction of the paper-formed structure.

Furthermore, in a circuit board nonwoven fabric according to a second invention in the present invention, the fiber diameter of the minor axis of the thick fibers is 10 μm or less.

Furthermore, in a circuit board nonwoven fabric according to a third invention in the present invention, the fiber diameter of the major axis of the thick fibers is 5 μm-20 μm.

Furthermore, in a circuit board nonwoven fabric according to a fourth invention in the present invention, the thick fibers and the fine fibers are aramid fibers.

Furthermore, in a circuit board nonwoven fabric according to a fifth invention in the present invention, the proportion of the total area of a nonwoven fabric CD cross section occupied by the thick fibers is 10% or less.

Furthermore, a circuit board prepreg according to a sixth invention in the present invention is obtained by impregnating the abovementioned circuit board nonwoven fabric with a resin.

Furthermore, in a circuit board prepreg according to a seventh invention in the present invention, the prepreg thickness is 120%-300% of the circuit board nonwoven fabric thickness.

Furthermore, a circuit board according to an eighth invention in the present invention is obtained by providing a circuit pattern on a surface of the abovementioned circuit board prepreg.

Effects of the Invention

Employing a circuit board nonwoven fabric having the predetermined features of the present invention makes it possible to improve smoothness, suppress an increase in cost, and also achieve a thinner structure.

EMBODIMENTS OF THE INVENTION

Exemplary embodiments of one invention according to the present invention will be described in detail below.

Figure 1:
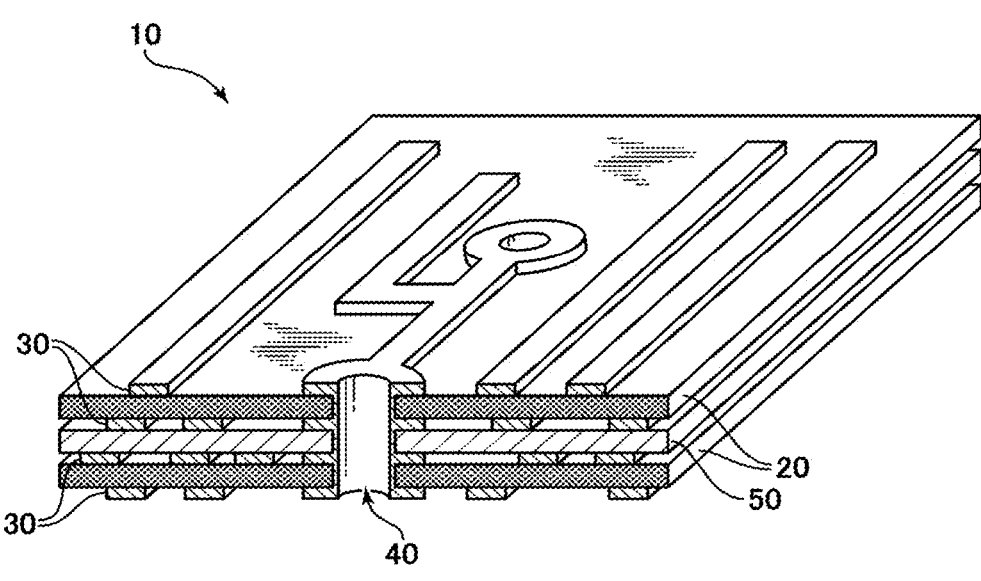
FIG. 1 shows a cross section of a circuit board according to an embodiment of the present invention.

FIG. 1 shows a cross section of a circuit board 10 according to an embodiment of the present invention, where prepregs 20 are stacked in multiple layers in a thickness direction on a core material 50, and the materials are consolidated by compression to form a plate-shaped structure. As shown in FIG. 1, circuit patterns 30 are provided on front and rear surfaces of each prepreg 20, and the circuit patterns 30 on the front and rear surfaces of each single prepreg 20 are placed in an appropriate state of electrical connection by means of a through-hole 40 provided from the front surface to the rear surface side. Furthermore, the circuit patterns 30 provided between the upper and lower prepregs 20 are placed in an appropriate state of electrical connection by way of the through-hole 40.

Figure 2:
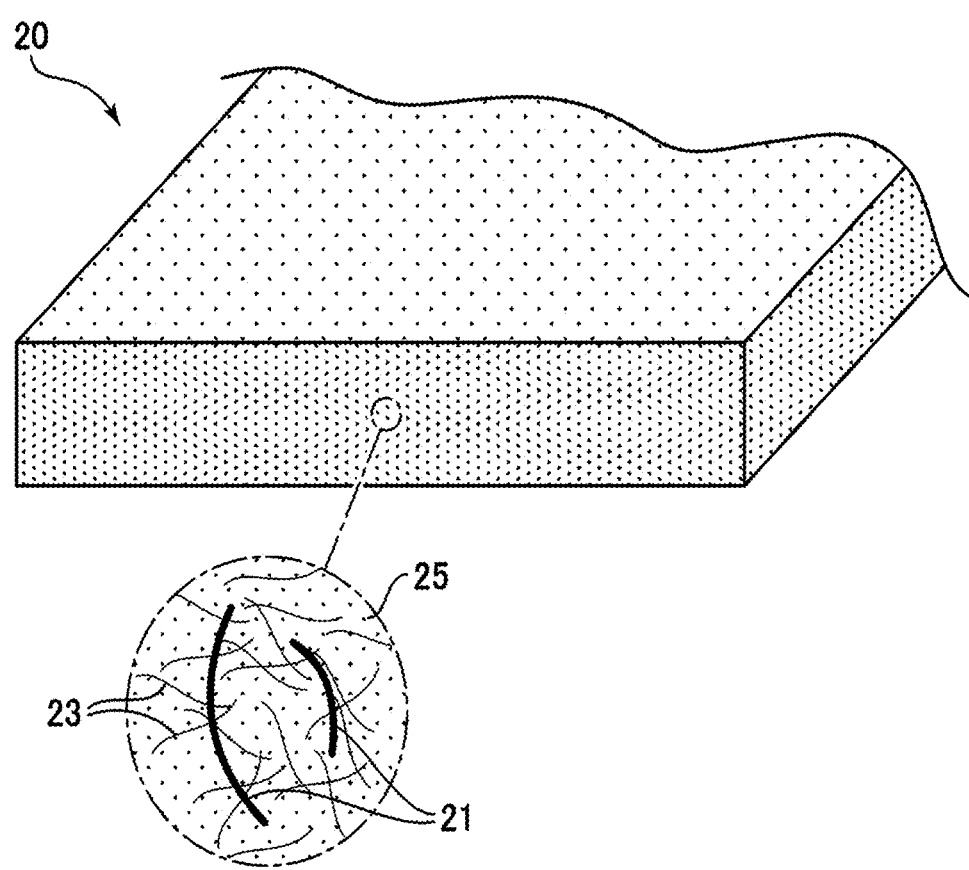
FIG. 2 shows a prepreg obtained by impregnating a nonwoven fabric of the present invention with a resin and forming the materials into a flat plate shape.
Figure 3:
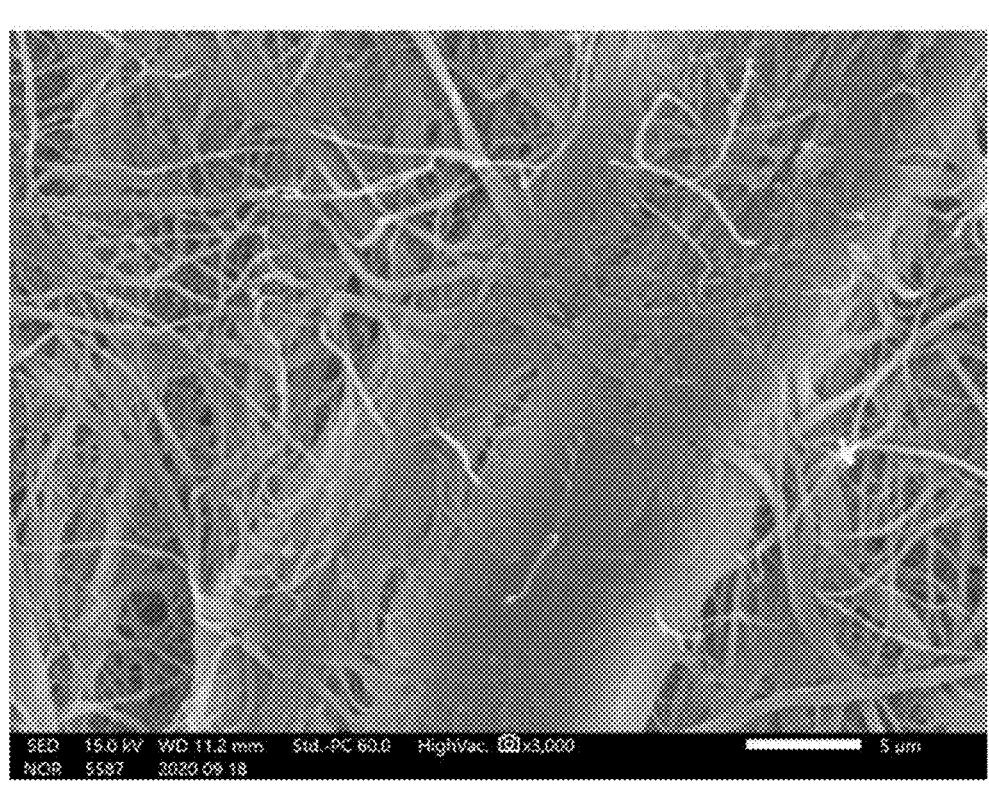
FIG. 3 shows a scanning electron microscope photograph of the nonwoven fabric of the present invention.
Figure 4:
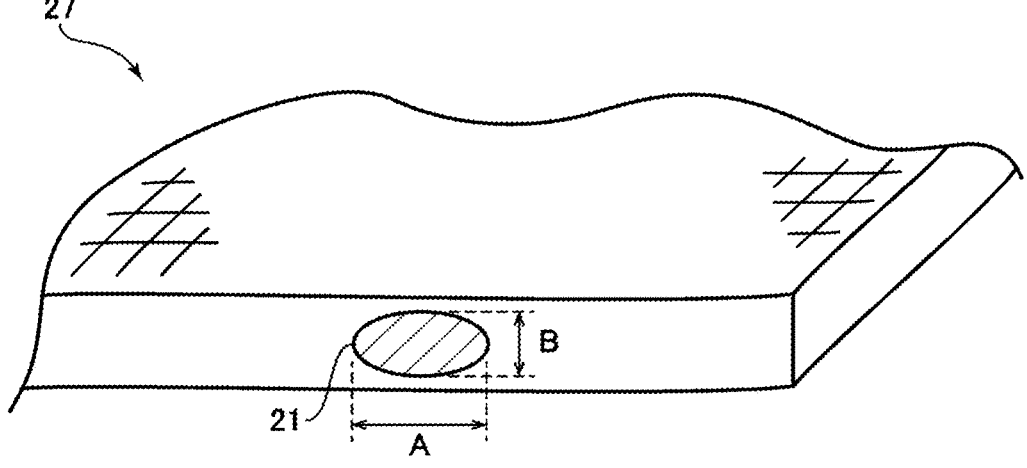
FIG. 4 shows a thick fiber having a flat shape with a major axis and a minor axis (planar direction length A, thickness direction length B) in the nonwoven fabric of the present invention.

As shown in FIG. 2, the prepregs 20 are obtained by impregnating a nonwoven fabric comprising thick fibers 21 and fine fibers 23 with a resin 25 and forming the materials into a flat plate shape, the circuit patterns are formed on the front and rear surfaces thereof, as mentioned above, and a through-hole penetrating the front and rear surface sides is provided on a land portion which is provided at a suitable location of the circuit pattern. Furthermore, as shown in the scanning electron microscope photograph of FIG. 3, the nonwoven fabric of the present invention is formed by intertwining thick fibers and fine fibers, and a feature of the nonwoven fabric lies in the fact that the thick fibers are longer than the fine fibers. Furthermore, as shown in FIG. 4, the thick fibers 21 have a flat shape with a major axis and a minor axis, the minor axis being oriented in a thickness direction of a paper-formed structure. In contrast, there are a far greater number of fine fibers than thick fibers, and the thick fibers and the fine fibers are intertwined to form a nonwoven fabric 27.

A circuit board nonwoven fabric according to the present invention comprises a paper-formed structure which comprises a plurality of thick fibers in which the portion of greatest fiber diameter is 5 μm or greater, and a plurality of fine fibers in which the portion of greatest fiber diameter is less than 5 μm, an average fiber length of the thick fibers is greater than an average fiber length of the fine fibers, the number of fine fibers is greater than the number of thick fibers, and the thick fibers have a flat shape with a major axis and a minor axis, the minor axis being oriented in a thickness direction of the paper-formed structure.

As indicated above, the present invention employs not only the plurality of fine fibers in which the portion of greatest fiber diameter is less than 5 μm, but also the plurality of thick fibers in which the portion of greatest fiber diameter is 5 μm or greater, so it is possible to suppress an increase in the cost of the circuit board nonwoven fabric as compared to when only expensive fine fibers are used, and it is also possible to increase the strength of the circuit board nonwoven fabric.

Furthermore, the fine fibers and the thick fibers which have a greater fiber length than the fine fibers are used for wet papermaking, which makes it possible to avoid an increase in costs. That is to say, when wet papermaking is performed with only short fine fibers, the amount of fine fibers becoming detached from the wire increases during wet papermaking, causing a deterioration in yield, but by using the fine fibers together with the thick fibers which have a greater fiber length than the fine fibers, the fine fibers become entwined in the thick fibers and the thick fibers remain on the wire, whereby detachment from the wire is reduced and the yield can be improved.

In addition, according to the present invention, there are fewer thick fibers than fine fibers, and, moreover, the thick fibers have a flat shape with a major axis and a minor axis, the minor axis being oriented in the thickness direction of the paper-formed structure, and therefore the thickness of the circuit board nonwoven fabric can be reduced and the smoothness of the circuit board nonwoven fabric can also be improved. Accordingly, the smoothness of the circuit board nonwoven fabric, the circuit board prepreg employing same, and the circuit board employing the circuit board prepreg can furthermore be improved.

Furthermore, according to the present invention, the paper-formed structure is obtained by using not only the plurality of fine fibers in which the portion of greatest fiber diameter is less than 5 μm, but also the plurality of thick fibers in which the portion of greatest fiber diameter is 5 μm or greater, and therefore the tensile strength of the circuit board nonwoven fabric can also be enhanced, and as a result it is possible to reduce the amount of resin used to form the circuit board prepreg and a thinner structure can be achieved.

According to the present invention, the portion of greatest fiber diameter (major axis) of the thick fibers is 5 μm or greater, preferably 7 μm or greater, more preferably 9 μm or greater, and most preferably 11 μm or greater. Furthermore, the upper limit of the fiber diameter of the major axis of the thick fibers may be appropriately set by a person skilled in the art, but is preferably 25 μm or less, more preferably 20 μm or less, and most preferably 15 μm or less. The fiber diameter of the major axis of the thick fibers is preferably 5 μm-20 μm, and more preferably 9 μm-15 μm. In particular, the smoothness of the circuit board can be improved by setting the fiber diameter of the major axis of the thick fibers at 5 μm-20 μm. When thick fibers in which the portion of greatest fiber diameter is 5 μm or greater are not included, the tensile strength of the nonwoven fabric is inadequate, paper tearing occurs during papermaking and prepreg production, and stable production is not possible. Furthermore, when the fiber diameter is large, a base material surface may be obstructed by the fibers, making it difficult for the interior of the base material to be impregnated with the resin, and voids may form so that producibility deteriorates. Furthermore, there is a relative increase in a thickness direction dimension of the nonwoven fabric, so the circuit board nonwoven fabric becomes thicker.

Furthermore, the fiber diameter of the narrowest portion (minor axis) of the thick fibers may be appropriately set by a person skilled in the art in a range below the fiber diameter of the major axis, and, under the condition that the fiber diameter of the minor axis is less than the fiber diameter of the major axis, said fiber diameter of the minor axis is preferably 12 μm or less, more preferably 10 μm or less, and most preferably 8 μm or less. The circuit board can be made thinner by setting the fiber diameter of the minor axis of the thick fibers at the abovementioned values. When the fiber diameter of the minor axis is thicker, the circuit board nonwoven fabric comprising the thick fibers becomes thicker and it is not possible to meet the recent requirement of achieving a thinner structure.

Furthermore, the portion of greatest fiber diameter of the fine fibers according to the present invention is less than 5 μm, more preferably less than 3 μm, and most preferably less than 1 μm. When fine fibers in which the portion of greatest fiber diameter is less than 5 μm are not included, there are fewer fibers per unit weight and fewer points of interlacing between fibers, so the sheet strength is inadequate, breakage of the paper occurs during papermaking and prepreg production, and the smoothness of the circuit board nonwoven fabric also decreases.

The average fiber lengths of the thick fibers and fine fibers according to the present invention may be determined by a person skilled in the art based on common technical knowledge by actually measuring the fiber lengths of a specific number of fibers, and, for example, the nonwoven fabric is defibrated in water and the fibers are dried on a prepared slide, then the fiber lengths of any 50 fibers included in a captured image of the dried fibers are measured, and the counted average value may be used as the average fiber length. When the average fiber length of the thick fibers is less than the average fiber length of the fine fibers, the amount of fibers becoming detached from the wire increases during papermaking, and the cost increases because of poor yield.

Furthermore, for the number of thick fibers and fine fibers also, it is possible to compare the number of thick fibers and fine fibers by actually counting the number of fibers confirmed in a fixed range in an image which has actually been captured, for example. The number of fine fibers is preferably at least twice the number of thick fibers, more preferably at least 2.5 times, and most preferably at least three times. If there are fewer fine fibers than thick fibers, the number of fibers per unit weight decreases so that there are fewer points of interlacing between fibers, the sheet strength is inadequate, and paper tearing occurs during papermaking and prepreg production.

In the paper-formed structure constituting the nonwoven fabric according to the present invention, the thick fibers which have a flat shape (which have a major axis and a minor axis) have the feature of the minor axis being oriented in the thickness direction of the paper-formed structure (the nonwoven fabric). There is no particular limitation as to the method of controlling the fiber orientation in the nonwoven fabric which is actually produced, provided that the minor axis can be oriented in the thickness direction of the paper-formed structure (the nonwoven fabric), and a person skilled in the art may adopt a suitable means based on common technical knowledge, correspondingly with the various methods of producing the nonwoven fabric. In a papermaking process, for example, when the fibers are dispersed in water and dewatered via a mesh from below, the fibers are deposited on the mesh. At this time, the fiber cross section essentially faces toward the side of greater filtration resistance, and therefore, when flat fibers are used as the thick fibers, the fiber cross section thereof is such that the long side is naturally oriented sideways, so it is possible to obtain a nonwoven fabric in which the minor axis is oriented in the thickness direction of the paper-formed structure.

It is possible to confirm that the minor axis is oriented in the thickness direction by taking a cross section cut through the nonwoven fabric in a transverse direction (CD direction), and measuring a length A in a nonwoven fabric planar direction and a length B in a nonwoven fabric thickness direction in the cross sections of at least 10 thick fibers, then confirming that A>B based on the average values obtained from the measured values, for example. The number of thick fibers which are measured to determine the average values of A and B may be even greater, and, for example, the A dimension and B dimension may be measured for all of the thick fibers present in one field of view in a scanning microscope photograph of the nonwoven fabric cross section, and the same operation may be performed for multiple fields of view, then the average values of the A dimension and B dimension of all of the thick fibers measured may be calculated.

Furthermore, the proportion of the total area of the nonwoven fabric CD cross section occupied by the thick fibers (also referred to below as the "thick fiber proportion") may be set at 15% or less, for example, and is more preferably 10% or less. Here, the nonwoven fabric CD cross section represents a transverse section in the nonwoven fabric production direction. Furthermore, the cross-sectional area of the CD cross section includes not only the cross-sectional area of the thick fibers and fine fibers but also the voids between fibers, which is to say that it represents: [cross-sectional area of all fibers including thick fibers and fine fibers]+[area of voids (portion of the cross section where fibers are not present)]. When the proportion of the total area of the nonwoven fabric CD cross section occupied by the thick fibers is set at 10% or less, the smoothness of the circuit board can be improved. If the proportion of thick fibers is greater than 10%, the circuit board nonwoven fabric comprising these thick fibers becomes thicker, and it is therefore not possible to meet the recent requirement of achieving a thinner structure. Furthermore, a relative reduction in the proportion of fine fibers causes a deterioration in surface roughness and a reduction in the number of fibers per unit weight so that there are fewer points of interlacing between fibers and the strength is inadequate as a result, and paper tearing occurs during papermaking and prepreg production. The abovementioned proportion may be determined by measuring the total of the cross-sectional areas of thick fibers in a cross section cut through the nonwoven fabric in the transverse direction (CD direction) and dividing the result by the cross-sectional area of the circuit board nonwoven fabric.

The thick fibers and the fine fibers according to the present invention are preferably aramid fibers. When the thick fibers and the fine fibers are aramid fibers, the fine fibers and the thick fibers can be easily manufactured. Aramid fibers suitable for the circuit board nonwoven fabric of the present invention which may be used include para-aramid fibers such as polyparaphenylene terephthalamide, poly(paraphenylene-4,4'-biphenylene-dicarboxylic acid amide), and poly (paraphenylene-2,6-naphthalenedicarboxylic acid amide), or fibers obtained by copolymerizing a fixed amount (e.g., less than 10 wt %) of a diamine or diacid chloride with the above, but para-aramid fibers comprising polyparaphenylene terephthalamide as the main component and spun with the addition of polyvinylpyrrolidone are preferred. By adding polyvinylpyrrolidone, the plasticity of the fibers is increased, the fibers readily deform under pressure, etc., and it is simple to obtain flat fibers. By beating the para-aramid fibers, it is possible to obtain a circuit board nonwoven fabric suitable for the present invention. Forming the fibers into a pulp is referred to as beating (refining), and the beater is referred to as a refiner. Beating generally has three purposes: causing the fibers to swell, cutting the fibers, and fibrillating the fibers. Beating which is mainly to cut the fibers is referred to as free beating, and beating which is mainly to fibrillate the fibers is referred to as wet beating. The type of refiner which is selected, the blade shape, and operating conditions, etc. vary according to the type of beating process which is adopted. For example, there is no particular limitation to using equipment which is conventionally used for beating, such as a single-disc refiner, a double-disc refiner, or a PFI mill. When a PFI mill is used, for example, the abovementioned para-aramid fibers to which pure water has been added to obtain a sample concentration of 5% are subjected to beating with a roll/housing interval of 0.1 mm and subjected to wet papermaking in a standard PFI mill (produced by Kumagai Riki Kogyo Co., Ltd.) which is a beater conforming to JIS P8221-2 "Pulp—Beating Method—Part 2: PFI mill method" (ISO 5264-2), and it is thereby possible to obtain a circuit board nonwoven fabric suitable for the present invention. In the present invention, a person skilled in the art may appropriately select the beating equipment and beating conditions, without any particular limitation.

The circuit board nonwoven fabric of the present invention may be formed into a wet nonwoven fabric by means of any method such as a spunlace production method, an air-through production method, or a papermaking process, but the wet nonwoven fabric formed into a sheet is preferably obtained by means of a papermaking process. In the papermaking process, when the fibers are dispersed in water and dewatered via a mesh from below, and the fibers are deposited on the mesh, the fibers are deposited on the mesh. At this time, the fiber cross section essentially faces toward the side of greater filtration resistance, and therefore, when flat fibers are used as the thick fibers, the fiber cross section thereof is such that the long side is naturally oriented sideways, so it is possible to obtain a nonwoven fabric in which the minor axis is oriented in the thickness direction of the paper-formed structure. When a papermaking process is used to form a sheet, Fourdrinier papermaking, Tanmo papermaking, cylinder papermaking and combinations thereof, etc. may be used without particular limitation. A layer formed by Fourdrinier papermaking or Tanmo papermaking is preferred because extremely fine and short fibers are easily trapped. Furthermore, after sheet formation, the thickness and void ratio may be adjusted by a calendering treatment.

Furthermore, the circuit board prepreg is produced by impregnating the circuit board nonwoven fabric of the present invention with a resin. The circuit board prepreg can be easily produced by impregnating the circuit board nonwoven fabric with the resin, and the strength of the board can be enhanced. The circuit board prepreg obtained by impregnating the circuit board nonwoven fabric of this embodiment with the resin may generally be formed by impregnation with an epoxy resin or phenolic resin, application of heat, and curing. For example, adhesion with the copper foil is improved when a heat-curable resin, e.g., an epoxy resin, phenolic resin, polyurethane resin, or melamine resin, etc. is added, and therefore a water-dispersible binder comprising these heat-curable resins may also be added. However, the resin for impregnation is not limited to the examples described above, and any resin which is normally used may be employed.

The thickness of the circuit board prepreg may be set at 120%-300% of the thickness of the circuit board nonwoven fabric, more preferably at 130%-200%, and most preferably at 140%-180%. The circuit board can be made thinner by setting the prepreg thickness at the values described above. If the prepreg thickness is less than 120%, the fibers on the surface of the circuit board nonwoven fabric are exposed on the prepreg surface and smoothness deteriorates, which may cause wiring breakages in the circuit pattern and greater variations in through-holes. If the prepreg thickness is greater than 300%, it is not possible to meet the recent requirement of achieving a thinner structure.

The prepreg may preferably be used as a circuit board base material and a laminated board. The circuit board base material and the laminated board may be produced by a method which is generally implemented. That is to say, a laminated board for a circuit may be produced by laminating the prepreg of the present invention on a core material as an insulating layer, and further laminating a conducting wire layer comprising a metal foil. A structure obtained by bonding a metal foil to both surfaces of a resin plate, or a metal plate, etc. may be used as the core material. Gold, silver, copper, nickel or aluminum, etc. may be used as the metal foil bonded to the resin plate, the metal plate, and the metal foil of the conducting wire layer, but there is no limitation to the examples above and any metal which is normally used may be employed. A thin, high-smoothness and high-strength circuit board can be produced by providing a circuit pattern on the surface of the circuit board prepreg of the present invention by means of a normal method.

The present invention will be described in further detail below through examples, but the invention of this application is not limited to these modes.

EXAMPLES

Specific measurements of the characteristics of the circuit board nonwoven fabric of this embodiment (also referred to below simply as the "nonwoven fabric") were performed under the following conditions using the following methods.
[Cross-Sectional Structure]

The nonwoven fabric was cut in the transverse direction (CD direction) using a sharp cutter, and the cross section was imaged using a scanning electron microscope (model JCM-IT200 (produced by JEOL Ltd.)).

The length in the nonwoven fabric planar direction was taken as A and the length in the nonwoven fabric thickness direction was taken as B in the fiber cross sections included in the imaged nonwoven fabric. Furthermore, fibers in which the portion of greatest fiber diameter was 5 μm or greater were taken as thick fibers, and fibers in which the portion of greatest fiber diameter was less than 5 μm were taken as fine fibers in the fiber cross sections included in the imaged nonwoven fabric, and the number of each was counted. The total of the cross-sectional areas of thick fibers was then measured and divided by the cross-sectional area of the circuit board nonwoven fabric, and this was taken as the proportion of the total area occupied by the thick fibers (also referred to below as the "thick fiber proportion").

It should be noted that the imaging and counting were carried out at any 10 locations in each example, and numerical values were calculated using counted average values. For the dimensions of A and B, all of the thick fibers present in the field of view at each location (magnification 200 times (imaging area 64 μm×48 μm)) were measured, and the average values of the A dimension and B dimension of all of the thick fibers measured were calculated.

[Average Fiber Length]

The nonwoven fabric was defibrated in water and the fibers were dried on a prepared slide, then the fibers were imaged using a microscope (model VHX-6000 (produced by Keyence Corp.)). For the fibers included in the captured image, the fiber lengths of any 50 of each of the thick fibers and the fine fibers were measured in each example, and the average fiber lengths were calculated using the counted average values.

[Surface Roughness]

The mean deviation of the surface roughness of the nonwoven fabric and prepreg surfaces was measured using a surface tester (model KES-FB4 (produced by Kato Tech Co., Ltd.)) and used as an index of smoothness. It should be noted that measurements were performed three times in each example, and the counted average value was used as the surface roughness.

[Basis Weight]

The basis weight of the circuit board nonwoven fabric in the dry state was measured by the method stipulated in "JIS C 2300-2 'Cellulosic papers for electrical purposes—Part 2: Methods of test' 6 Basis weight".

[Thickness]

Using a micrometer with a measurement surface diameter of 6.35 mm set at a pressure of 155 kPa±15 kPa, the thickness at any five points on a single circuit board nonwoven fabric and prepreg was measured, and the thickness was calculated using the counted average value.

Example 1

Para-aramid fibers (polyparaphenylene terephthalamide; 1.7 dtex) were subjected to beating and then formed into a nonwoven fabric by Fourdrinier papermaking. Observation of the transverse section of the nonwoven fabric under a microscope showed that the major axis of the flat shape of all of the thick fibers was oriented in the nonwoven fabric planar direction. In the circuit board nonwoven fabric which was obtained, A was 12.1 μm and B was 6.2 μm, the average fiber length of the thick fibers was 0.9 mm, the average fiber length of the fine fibers was 0.4 mm, the number of thick fibers per imaged field of view was 3, and the number of fine fibers (microscope observation showed that all of the fiber diameters were clearly less than 5 μm; the same is also the case in the subsequent examples) was 10 or more. The thickness of this circuit board nonwoven fabric was 25 μm, the basis weight was 10.5 g/m 2, the thick fiber proportion was 4.2%, and the surface roughness was 0.71 μm.

Example 2

Fourdrinier papermaking was performed while varying the beating conditions and pressing conditions of the para-aramid fibers from those of example 1, after which calendering was performed to thereby obtain a circuit board nonwoven fabric in which the major axis of the flat shape of all of the thick fibers was oriented in the nonwoven fabric planar direction, A was 13.2 μm and B was 5.7 μm, the average fiber length of the thick fibers was 0.9 mm, the average fiber length of the fine fibers was 0.4 mm, the number of thick fibers per imaged field of view was 2.6, and the number of fine fibers was 10 or more. The thickness of this circuit board nonwoven fabric was 10 μm, the basis weight was 6.8 g/m 2, the thick fiber proportion was 9.7%, and the surface roughness was 0.63 μm.

Example 3

Fourdrinier papermaking was performed while varying the beating conditions and pressing conditions of the para-aramid fibers from those of example 1, and a circuit board nonwoven fabric was obtained in which the major axis of the flat shape of all of the thick fibers was oriented in the nonwoven fabric planar direction, A was 10.9 μm and B was 9.3 μm, the average fiber length of the thick fibers was 1.0 mm, the average fiber length of the fine fibers was 0.4 mm, the number of thick fibers per imaged field of view was 3.4, and the number of fine fibers was 10 or more. The thickness of this circuit board nonwoven fabric was 28 μm, the basis weight was 11.1 g/m 2, the thick fiber proportion was 9.1%, and the surface roughness was 0.77 μm.

Example 4

Fourdrinier papermaking was performed while varying the beating conditions and pressing conditions of the para-aramid fibers from those of example 1, after which calendering was performed to thereby obtain a circuit board nonwoven fabric in which the major axis of the flat shape of all of the thick fibers was oriented in the nonwoven fabric planar direction, A was 20.9 μm and B was 7.1 μm, the average fiber length of the thick fibers was 1.1 mm, the average fiber length of the fine fibers was 0.5 mm, the number of thick fibers per imaged field of view was 3.1, and the number of fine fibers was 10 or more. The thickness of this circuit board nonwoven fabric was 22 μm, the basis weight was 16.0 g/m 2, the thick fiber proportion was 14.1%, and the surface roughness was 0.69 μm.

Comparative Example 1

Fourdrinier papermaking was performed while varying the beating conditions and pressing conditions of the para-aramid fibers from those of example 1, and a circuit board nonwoven fabric was obtained in which the major axis of the flat shape of all of the thick fibers was oriented in the nonwoven fabric planar direction, A was 8.9 μm and B was 9.6 μm, the average fiber length of the thick fibers was 1.0 mm, the average fiber length of the fine fibers was 0.4 mm, the number of thick fibers per imaged field of view was 2.4, and the number of fine fibers was 10 or more. The thickness of this circuit board nonwoven fabric was 30 μm, the basis weight was 10.5 g/m 2, the thick fiber proportion was 3.2%, and the surface roughness was 0.95 μm.

Comparative Example 2

Fourdrinier papermaking was performed using a starting material obtained by mixing 70 mass % of para-aramid fibers and 30 mass % of aramid fibrid, after which calendering was performed to thereby obtain a circuit board nonwoven fabric in which the major axis of the flat shape of all of the thick fibers was oriented in the nonwoven fabric planar direction, A was 12.5 μm and B was 12.0 μm, the average fiber length of the thick fibers was 3.0 mm, the number of thick fibers per imaged field of view was 8.7, and the number of fine fibers was 0. The thickness of this circuit board nonwoven fabric was 52 μm, the basis weight was 34.2 g/m 2, the thick fiber proportion was 72%, and the surface roughness was 1.89 μm.

Comparative Example 3

Fourdrinier papermaking was attempted using a starting material that did not contain thick fibers and with the beating conditions of the para-aramid fibers varied from those of example 1, but paper tearing frequently occurred and a product could not be produced stably.

The circuit board nonwoven fabrics produced in the examples and comparative examples were then impregnated with an epoxy resin, after which they were dried to obtain prepregs. It should be noted that the thickness of the prepregs was adjusted by varying the pressure of pressing during resin impregnation.

Example 5

A prepreg was obtained by means of the method above while using the circuit board nonwoven fabric produced in example 1. The thickness of the prepreg produced was 40 μm (base material thickness ratio 160%), and the surface roughness was 0.45 μm.

Example 6

A prepreg was obtained by means of the same method as in example 5, except for the pressure of pressing, while using the circuit board nonwoven fabric produced in example 1. The thickness of the prepreg produced was 27 μm (base material thickness ratio 108%), and the surface roughness was 0.65 μm.

Example 7

A prepreg was obtained by means of the same method as in example 5, except for the pressure of pressing, while using the circuit board nonwoven fabric produced in example 1. The thickness of the prepreg produced was 83 μm (base material thickness ratio 332%), and the surface roughness was 0.49 μm.

Comparative Example 4

A prepreg was obtained by means of the same method as in example 5 while using the circuit board nonwoven fabric produced in comparative example 1. The thickness of the prepreg produced was 45 μm (base material thickness ratio 150%), and the surface roughness was 0.71 μm.

The results of evaluating the structures and various physical properties of the circuit board nonwoven fabrics from examples 1~4 and comparative examples 1-3 described above are shown in table 1, and the results of evaluating the structures and various physical properties of the prepregs from examples 5-7 and comparative example 4 are shown in table 2.

TABLE 1

| | Composition | Proportion mass % | Thickness μm | Basis weight g/m² | Thick fiber A dimension μm | Thick fiber B dimension μm | Thick fiber average length mm | Fine fiber average length mm | No. of thick fibers no. | No. of fine fibers no. | Thick fiber proportion % | Surface roughness μm |
|---|---|---|---|---|---|---|---|---|---|---|---|---|
| Example 1 | Beaten para-aramid | 100 | 25 | 10.5 | 12.1 | 6.2 | 0.9 | 0.4 | 3.0 | ≥10 | 4.2 | 0.71 |
| Example 2 | Beaten para-aramid | 100 | 10 | 6.8 | 13.2 | 5.7 | 0.9 | 0.4 | 2.6 | ≥10 | 9.7 | 0.63 |
| Example 3 | Beaten para-aramid | 100 | 28 | 11.1 | 10.9 | 9.3 | 1.0 | 0.4 | 3.4 | ≥10 | 9.1 | 0.77 |
| Example 4 | Beaten para-aramid | 100 | 22 | 16.0 | 20.9 | 7.1 | 1.1 | 0.5 | 3.1 | ≥10 | 14.1 | 0.69 |
| Comparative Example 1 | Beaten para-aramid | 100 | 30 | 10.5 | 8.9 | 9.6 | 1.0 | 0.4 | 2.4 | ≥10 | 3.2 | 0.95 |
| Comparative Example 2 | Para-aramid Fibrid | 7030 | 52 | 34.2 | 12.5 | 12.0 | 3 | — | 8.7 | 0 | 72 | 1.89 |
| Comparative Example 3 | Beaten para-aramid | 100 | | | | Sheet could not be formed | | | | | | |

TABLE 2

| Circuit board nonwoven fabric | Base material thick- ness μm | Prepreg thick- ness μm | Prepreg thick- ness ratio % | Surface rough- ness μm |
|---|---|---|---|---|
| Example 5 | Nonwoven fabric of example 1 | 25 | 40 | 160 | 0.45 |
| Example 6 | Nonwoven fabric of example 1 | 25 | 27 | 108 | 0.65 |
| Example 7 | Nonwoven fabric of example 1 | 25 | 83 | 332 | 0.49 |
| Comparative Example 4 | Nonwoven fabric of comparative example 1 | 30 | 45 | 150 | 0.71 |

In the thick fibers of comparative example 1, the length B in the thickness direction of the nonwoven fabric was greater than the length A in the planar direction of the nonwoven fabric, and these thick fibers did not have a shape in which the minor axis of the fiber cross-sectional length was oriented in the thickness direction of the nonwoven fabric. The surface roughness was therefore worse than in the examples. Furthermore, a comparison of example 5 and comparative example 4 showed that the prepreg of comparative example 4, which employed the nonwoven fabric of comparative example 1, had worse surface roughness. It is clear from this that thick fibers having a flat shape with a major axis and a minor axis, where the minor axis is oriented in the thickness direction of the paper-formed structure, are preferable.

Comparative example 2 employed a starting material obtained by mixing aramid fibrid as a binder, without containing fine fibers. The thickness was greater than in example 1, and the surface roughness was also worse without the fine fibers.

Furthermore, an attempt was made to produce a circuit board nonwoven fabric of 50 μm using only unbeaten para-aramid fibers without including fine fibers, but the wet paper strength was inadequate, and stable production was not possible. It is clear from this that it is preferable for the circuit board nonwoven fabric to comprise fine fibers having a maximum fiber diameter of 5 μm or less.

In comparative example 3, an attempt was made to produce a circuit board nonwoven fabric using a beaten starting material that did not contain thick fibers, but the wet paper strength was poor and a circuit board nonwoven fabric could not be stably produced without the thick fibers. It is clear from a comparison of comparative example 3 and the examples that it is preferable to include thick fibers having a maximum fiber diameter of 5 μm or greater.

In the circuit board nonwoven fabric of example 4, the fiber diameter of the major axis of the thick fibers in the flat shape was large at 20.9 μm, and consequently there was a deterioration in resin impregnation properties when a prepreg was formed, as compared with example 2. Furthermore, the thick fiber proportion was high at 14.1%, and consequently there was a deterioration in surface roughness as compared with example 2. It is clear from this that the fiber diameter of the major axis of the thick fibers is preferably smaller than 20 μm, and the thick fiber proportion is preferably 10% or less.

It is clear from a comparison of example 5 and example 6 that the surface roughness is smaller in example 5. This is believed to be because the prepreg was excessively thin in relation to the thickness of the base material in example 6, and therefore fibers on the surface of the base material were exposed on the prepreg surface. Furthermore, the surface roughness in example 7 was comparable with that of example 5, but the thickness was greater at 83 μm, which caused problems such as an increase in cost because of the greater amount of resin, and difficulty in achieving a thinner structure.

It is clear from a comparison of examples 5, 6 and 7 above that the prepreg thickness is preferably 120%-300% of the circuit board nonwoven fabric thickness.

As described above, according to the exemplary embodiments, it is possible to provide a circuit board nonwoven fabric which enables improved smoothness, and can also suppress an increase in costs, and moreover achieves a thinner structure. Furthermore, by using this circuit board nonwoven fabric, it is possible to improve the smoothness of a circuit board prepreg and a circuit board employing same, and to suppress an increase in costs while also achieving a thinner structure.

KEY TO SYMBOLS

10 . . . Circuit board
20 . . . Prepreg
21 . . . Thick fibers
23 . . . Fine fibers
25 . . . Resin
27 . . . Nonwoven fabric
30 . . . Circuit pattern
40 . . . Through-hole
50 . . . Core material

The invention claimed is:

1. A circuit board nonwoven fabric comprising a paper-formed structure which comprises a plurality of thick fibers in which the portion of greatest fiber diameter is 5 μm or greater, and a plurality of fine fibers in which the portion of greatest fiber diameter is less than 5 μm, characterized in that an average fiber length of the thick fibers is greater than an average fiber length of the fine fibers, the number of fine fibers is greater than the number of thick fibers, and the thick fibers have a flat shape with a major axis and a minor axis, the minor axis being oriented in a thickness direction of the paper-formed structure, wherein the fiber diameter of the minor axis of the thick fibers is 10 μm or less, and wherein the fiber diameter of the major axis of the thick fibers is 5 μm-20 μm.

2. The circuit board nonwoven fabric as claimed in claim 1, wherein the thick fibers and the fine fibers are aramid fibers.

3. The circuit board nonwoven fabric as claimed in claim 1, wherein the proportion of the total area of a nonwoven fabric CD cross section occupied by the thick fibers is 10% or less.

4. A circuit board prepreg wherein the circuit board nonwoven fabric as claimed in claim 1 is impregnated with a resin.

5. The circuit board prepreg as claimed in claim 4, wherein the prepreg thickness is 120%-300% of the circuit board nonwoven fabric thickness.

6. A circuit board wherein a circuit pattern is provided on a surface of the circuit board prepreg as claimed in claim 4.

* * * * *